(12) United States Patent
Fulga et al.

(10) Patent No.: US 7,756,500 B1
(45) Date of Patent: *Jul. 13, 2010

(54) ACTIVE INDUCTOR CIRCUITS FOR FILTERING IN A CABLE TUNER CIRCUIT

(75) Inventors: Stefan Fulga, Great Dunmow (GB); David Rahn, Kanata (CA)

(73) Assignee: SiGe Semiconductor Inc., Ottawa, Ontario (CA)

( * ) Notice: Subject to any disclaimer, the term of this patent is extended or adjusted under 35 U.S.C. 154(b) by 2302 days.

This patent is subject to a terminal disclaimer.

(21) Appl. No.: 10/349,938

(22) Filed: Jan. 24, 2003

Related U.S. Application Data

(60) Provisional application No. 60/351,011, filed on Jan. 25, 2002.

(51) Int. Cl.
*H04B 1/06* (2006.01)

(52) U.S. Cl. .......... 455/266; 455/188.1; 455/188.2; 455/182.3; 455/179.1; 455/191.1; 455/192.2; 455/197.2; 455/227; 455/307; 455/333; 455/339; 348/725; 348/731; 327/556

(58) Field of Classification Search .......... 455/266, 455/183.1, 188.1, 188.2, 182.3, 179.1, 191.1, 455/197.2, 192.2, 227, 307, 333, 339; 333/174; 327/556; 348/725, 731
See application file for complete search history.

(56) References Cited

U.S. PATENT DOCUMENTS

| | | | | |
|---|---|---|---|---|
| 4,496,859 A | * | 1/1985 | Crooks | 327/556 |
| 4,571,560 A | * | 2/1986 | Dobrovolny | 333/174 |
| 5,483,209 A | * | 1/1996 | Takayama | 333/174 |
| 5,752,179 A | * | 5/1998 | Dobrovolny | 455/266 |
| 6,177,964 B1 | | 1/2001 | Birleson et al. | |
| 6,472,957 B1 | * | 10/2002 | Dobrovolny | 333/174 |
| 2003/0050026 A1 | * | 3/2003 | Connell et al. | 455/183.1 |

\* cited by examiner

*Primary Examiner*—Edward Urban
*Assistant Examiner*—Junpeng Chen
(74) *Attorney, Agent, or Firm*—Townsend and Townsend and Crew LLP

(57) ABSTRACT

An integrated front-end filter for a tuner provides an array of from several to a multitude of passbands, each for passing at least one but less than all channels designated in a band of frequencies. Each passband is exclusively selectable. The integrated front end filter includes at least one active filter unit with an active reactance element in either of fixed and variable filter configurations and a decoder coupled to said at least one active filter unit and being responsive to a control signal for selecting a one of the passbands. In one example a multitude of active filter units of fixed filter configuration provide the multitude of passbands. Each data is stored at a predetermined location and reproduced in response to a corresponding control data signal from a tuner controller. Each data characterizes one of the plurality of passbands. The filter element is switchable from one passband to another in response to the control data signal. Lower power dissipation and lesser requirements of an on-following integrated circuitry tuner permit a reduction of "off chip" connections and cost.

4 Claims, 6 Drawing Sheets

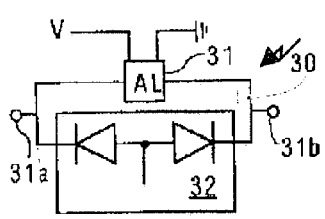
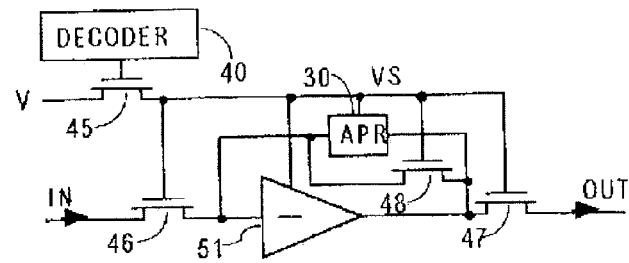
Fig. 3
Fig. 4
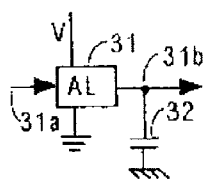
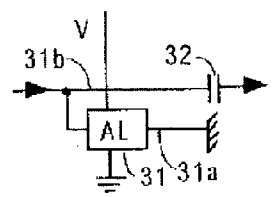
Fig. 5a
Fig. 5b
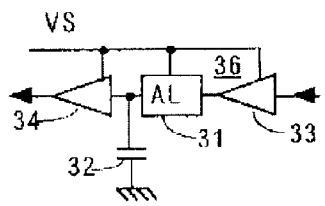
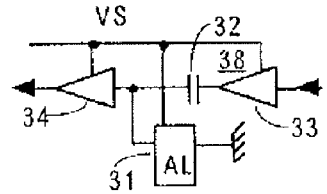
Fig. 5c
Fig. 5d
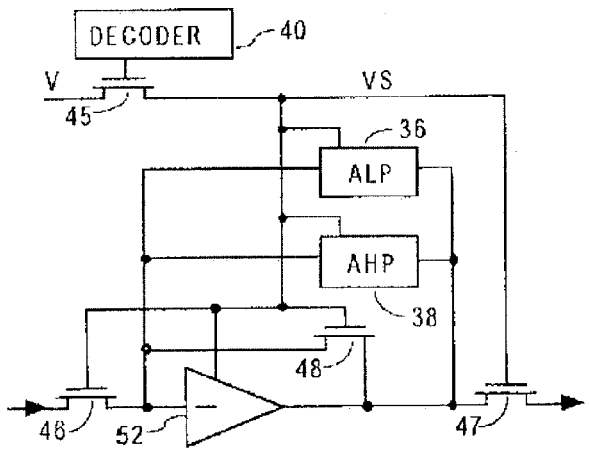
Fig. 6

ACTIVE INDUCTOR CIRCUITS FOR FILTERING IN A CABLE TUNER CIRCUIT

This application claims the benefit of U.S. Provisional Application No. 60/351,011 filed Jan. 25, 2002.

FIELD OF THE INVENTION

The invention relates to the area of cable tuner circuits and more specifically to the area of active inductor and capacitor circuits for use in filtering within cable tuner integrated circuits.

BACKGROUND OF THE INVENTION

Cable tuner circuits are used to receive a television signal from a television signal provider and to tune into a single channel within the television signal in order to present audio and video information from that channel to an end user. Cable tuners that operate using a superheterodyne circuit for use in a superheterodyne method of processing television signal information are commonplace. A superheterodyne receiver converts a desired signal to an intermediate frequency (IF) for filtering using a fixed bandpass filter. Signals having been passed through the fixed bandpass filter are processed by a second primary component of the receiver. A fixed bandpass filter is preferred because the filter characteristics are more readily and precisely determinable and hence the desired signal is more readily distinguishable from noise and other unwanted signals. Surface acoustic wave (SAW) filters are exemplary of the state of the art fixed bandpass filters used in television tuners.

SAW filter, brought upon a significant change in tuner design. With the use of SAW filters, some discrete filter components such as capacitors and manually tuned inductors used within the tuner circuit were reduced in number. With the use of SAW filters, filtering performance is improved within tuners as compared to prior techniques. Additionally, through the use of SAW filters, tuners were manufactured that required less space and were somewhat less costly than their counterparts. However, the SAW filter, which is fabricated on a ceramic substrate, is an off-chip device. It is also a rather low impedance device, and thus, requires low impedance matching to its input port. Additionally with the use of SAW filters, prior signal amplification requirements result in complications such as significant amplifier power consumption. Furthermore, broadband circuits, especially amplifier circuits, tend to consume more power as compared to narrower band circuits. Consequently, as the upper frequency for receivable TV signals increases, the power consumption of broadband amplifiers increases, particularly when used in combination with SAW filters. Heat dissipation and heat concentration in the already reduced surface area of a small TV tuner adds heat stress to the circuit components therein as well as to nearby elements of the electronic apparatus. The consequent heat stress thus unfavorably affects the functional reliability of both the tuner and any nearby elements. Furthermore, when more electrical components that are used within tuner circuits, more signal delays are observed as well as signal artifacts.

A need therefore exists to provide an improved filter in cable tuner circuits that consumes less electrical power than conventional designs. It is therefore an object of the invention to provide a television tuner having filters that are integrable within a semiconductor substrate and one that lends itself to miniaturization.

SUMMARY OF THE INVENTION

In accordance with the invention there is provided a tuner for receiving information signals within a channel selected from within a plurality of channels within a predetermined frequency band, the tuner comprising: a first filter for providing a passband, the passband being characterized by a bandwidth sufficiently broad to admit signals in at least one of the plurality of channels with lesser attenuation than other signals; an input port for receiving information signals and conducting the received information signals to the first filter; an output port for conducting any signals having been admitted by the first filter; and, superheterodyne circuitry including a mixer and a second filter for processing any signals coupled thereto and to provide them via a second output port and discriminating the received information signals within the selected channel, wherein at least one of the first filter and the second filter comprises active and passive elements including an artificial inductance.

In accordance with the invention there is provided an integrated front end filter in a tuner for providing an array of passbands, each for passing at least one but less than all channels designated in a band of frequencies, each passband of said array of passbands being exclusively selectable, the integrated front end filter comprising: a control signal input port for receiving a control signal; at least one active filter unit including an active reactance element in either of fixed and variable filter configurations; and, a decoder coupled to said at least one active filter unit and being responsive to the control signal for selecting a one of the passbands.

In accordance with the invention there is provided a method of tuning to a predetermined signal having a predetermined frequency band from within a plurality of channels comprising the steps of: receiving the plurality of channels; providing a filter having a bandwidth being sufficiently broad to admit the signal signals in at least one of the plurality of channels with lesser attenuation than other signals, the filter comprising active and passive elements including an artificial inductance; filtering and amplifying a channel from the plurality of channels using the filter.

In accordance with the invention there is provided an integrated circuit tuner front end, responsive to a tuner controller signal, for tuning to a designated information modulated signal from a plurality of multiplexed information modulated signals each in a predetermined band of frequencies, comprising: an input port for receiving the multiplexed information modulated signals; a first filter for passing all the multiplexed information modulated signals and for attenuating signals that are other than the multiplexed information modulated signals; a first amplifier for amplifying all the passed multiplexed information modulated signals from the first filter; a first IF filter for receiving the amplified and passed multiplexed information modulated signals from the first amplifier, the first IF filter for selecting at least one of a designated information modulated signal; a frequency conversion circuit for receiving a selected at least one of a designated information modulated signal and for converting a baseband frequency thereof; and, a second IF filter for receiving the converted signal from the frequency conversion circuit and for passing a single designated information modulated signal to an output port thereof, the integrated tuner circuit absent an amplifier circuit electrically between the first IF filter and the second IF filter.

In accordance with the invention there is provided an integrated front end filter in a tuner for providing an array of passbands, each for passing at least one but less than all channels designated in a band of frequencies, each passband of said array of passbands being exclusively selectable, the integrated front end filter comprising: at least one active filter unit including an active reactance element in either of fixed and variable filter configurations; and, a decoder coupled to said at least one active filter unit and being responsive to a control signal for selecting a one of the passbands.

BRIEF DESCRIPTION OF THE DRAWINGS

Exemplary embodiments of the present invention will be described in conjunction with the following drawings, in which:

FIG. 3 illustrates a block schematic diagram of an example of an active parallel resonant circuit, useful for providing a filter and intended for integrated circuit manufacture;

FIG. 4 illustrates a block schematic diagram of an example of a switchably selective filter including an active parallel resonant circuit as illustrated in FIG. 3;

FIGS. 5a and 5b illustrates block schematic diagrams of lowpass and highpass filter circuit units, respectively, where any of which are variously useful for providing a filter in a tuner;

FIGS. 5c and 5d illustrates block schematic diagrams of selectively activatable lowpass and highpass filter circuits, respectively, incorporating the filter units illustrated in FIGS. 5a and 5b respectively;

FIG. 6 illustrates a block schematic diagram of another example of a switchably selective filter including active high pass and low pass circuits as illustrated in FIGS. 5c and 5d;

DETAILED DESCRIPTION OF THE INVENTION

Figure 1:
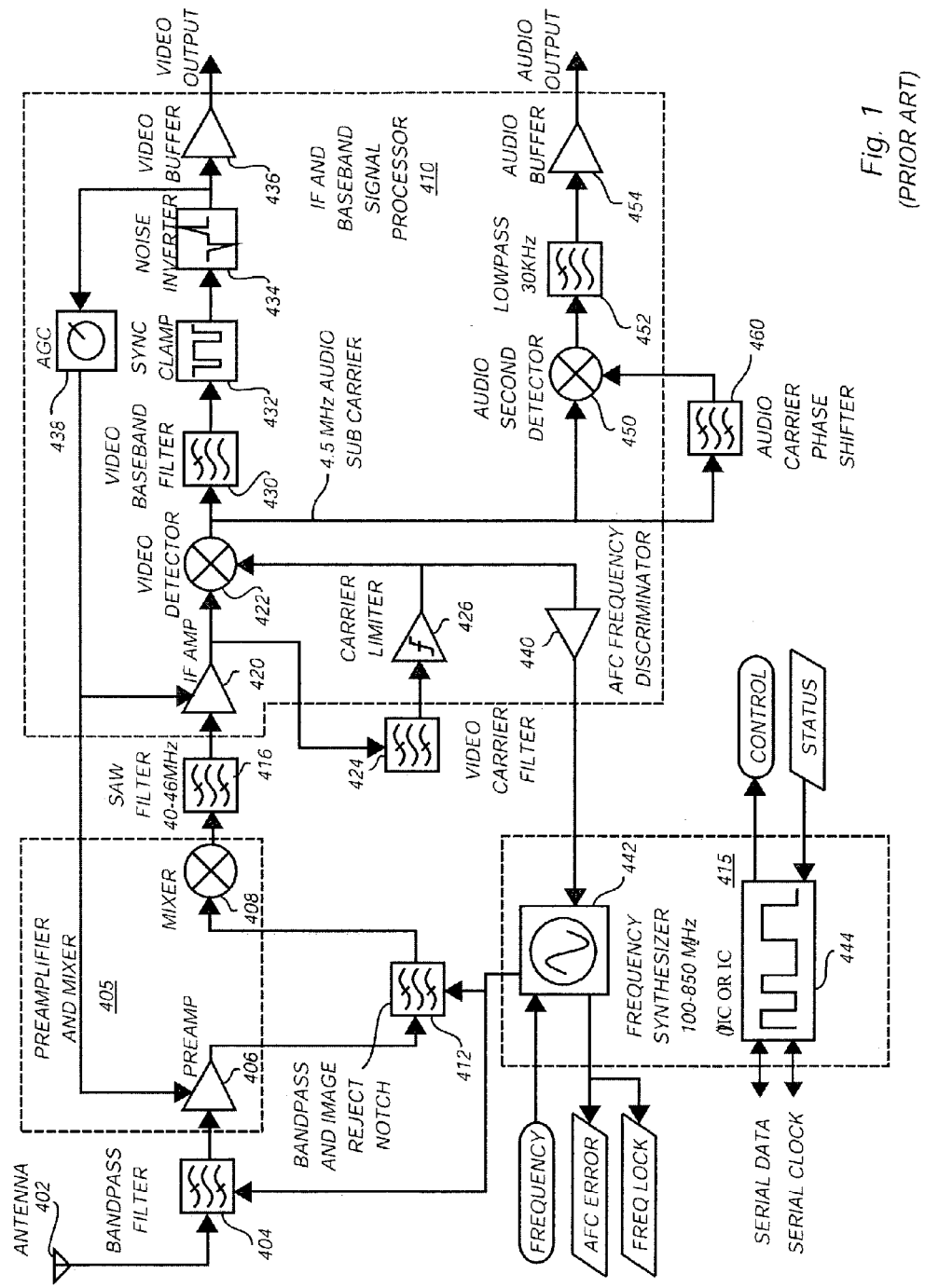
FIG. 1 illustrates a block schematic diagram of a prior art television tuner with double conversion in accordance with that shown in referenced as prior art in the U.S. Pat. No. 6,177,964.

The prior art television (TV) tuner illustrated in FIG. 1 is shown as being state-of-the-art in a discussion of prior art U.S. Pat. No. 6,177,964, entitled "Broadband Integrated Television Tuner".

Referring to FIG. 1, the prior art TV tuner is described as being highly miniaturized, but not fully integrated. The prior art TV tuner is intended to reside within in a single metallic shielding structure, not shown. The shielding structure houses a printed circuit board, upon which, all of the tuner components are mounted and electrically connected. Hence the prior art TV tuner is designed as a module, which is intended for mounting on various printed circuit boards to allow for direct connection of the input and output signals to appropriate terminations within a television receiving system. The metallic shielding structure prevents undesired external signals from interfering with the operation of the prior art TV tuner and prevents the prior art TV tuner from radiating signals that might otherwise interfere with the operation of external devices.

The prior art TV tuner includes three integrated circuits: a preamplifier mixer circuit 405, an intermediate frequency (IF) and baseband signal processor 410 and frequency synthesizer, and an Inter Integrated Circuit (IIC or I2C) bus interface 415. The prior art TV tuner also includes discrete components, including a bandpass filter 404, a bandpass and image reject notch filter 412, a surface acoustic wave (SAW) filter 416, a video carrier filter 424, and an audio carrier phase shifter 460.

The prior art TV tuner receives a standard television RF signal from either an antenna 402 or a cable system connection (not shown) through the bandpass filter 404. The filter 404 is a narrow bandpass tracking filter which attenuates most of the television channels in distinction to the desired channel so that the potential of any interference from any undesired signals is reduced. The bandpass filter 404 reduces the image response caused by a first mixer 408 and also attenuates signals, which are not present in a fairly narrow (100 MHz) range about the desired signal. Finally, as the prior art TV tuner is specifically intended to operate with antenna supplied signals, known interference signals, such as FM broadcast, shortwave service signals, signals in the intermediate frequency band, and Citizen Band radio signals, are specifically rejected by the filter 404. The bandpass filter 404 is comprised of discrete elements, including capacitors, inductors and varactor diodes.

A preamplifier 406, in the preamplifier and mixer circuit 405, receives signals from the output port of the bandpass filter 404 and raises the signal level as much as 10 dB with a minimum increase in noise level, typically 8-10 dB. The gain of the preamplifier 406 is controlled by an automatic gain control (AGC) circuit 438, so that when a very strong signal enters the prior art TV tuner, overall gain is reduced, resulting in less distortion in the preamplifier 406.

An output signal of the preamplifier 406 is sent to a bandpass and image reject notch filter 412, with the same basic requirement of minimizing the passage of potential interference signals. Filter 412 is external to the preamplifier and mixer circuit 405 and is comprised of discrete elements, including capacitors, inductors and varactor diodes.

An output signal from the bandpass and image reject notch filter 412 then propagates to the mixer 408, in the preamplifier and mixer circuit 405. The mixer 408 mixes the output signal from the filter 412 with a local oscillator signal received from an output port of a frequency synthesizer 442 in the frequency synthesizer and I2C bus interface 415. The frequency synthesizer 442 is operated to provide the local oscillator signal having a frequency chosen to be higher than the desired receiver carrier by 43.75 MHz, and thus a difference signal is output from the mixer 408 at 43.75 MHz. Due to the operation of the mixer 408, there is an image signal created at 91.5 MHz above the frequency of the input signal, which is removed by the filter 404 and the filter 412 under control of the I2C 415. As the signal frequency of the frequency synthesizer 442 is tuned to receive signals of different carrier frequencies, the bandpass filters 404 and 412 are tuned to properly pass only the desired signals and not mixer images.

The frequency synthesizer 442 receives an input frequency reference signal (usually 16 bits) and outputs status signals, AUTOMATIC FREQUENCY CONTROL (AFC) ERROR and FREQUENCY (FREQ) LOCK. Additionally, a tuning signal, which is used by a voltage controlled oscillator (VCO) (not shown) in the frequency synthesizer 442, is output from frequency synthesizer 442 to the bandpass filters 404 and 412 to effect the tuning thereof.

The difference signal at 43.75 MHz output from the mixer 408 passes through a surface acoustic wave (SAW) filter 416, which reduces the bandwidth of the signal to only one channel (6 MHz for the NTSC standard) and applies a linear attenuation in frequency known as the Nyquist slope around the visual carrier frequency. The linear attenuation by the SAW filter 416 converts this signal from a vestigial sideband signal to one that is equivalent to a single sideband with an added carrier signal. A significant disadvantage of the SAW filter 416 is that it is typically very lossy, having a loss of about 25 dB across its passband. Hence, a low output impedance preamplifier (not shown) amplifies the input signal provided to the off chip SAW filter by a corresponding amount to minimize noise effects. Unfortunately, heat is generated by the power amplification and the SAW filter attenuation. This heating is significantly large as compared with other functions in the prior art TV tuner.

The output signal from the SAW filter 416 is brought on chip and is received by an IF amplifier 420 in the IF and baseband signal processor 410. The IF amplifier 420 provides an output signal that is gain controlled by an automatic gain control (AGC) circuit 438, prior to further signal processing.

The output signal from the IF amplifier 420 is received by a video detector 422 and is also sent off-chip to the external video carrier filter 424, where at this stage video demodulation is performed. The video detector 422 is a mixer with its local oscillator input port connected to the output port of the video carrier filter 424 via a carrier amplitude limiter 426. The output signal from the carrier limiter 426 is an in-phase representation of the video carrier signal limited to remove any amplitude modulation. The output signal from the carrier limiter 426 is received by the video detector 422, which mixes the output signal of the carrier limiter 426 with the output signal of IF amplifier 420. An AFC frequency discriminator 440 is used in the prior art TV tuner to detect any difference between the carrier frequencies in the video carrier signal from the carrier limiter 426 and a known valid carrier frequency reference to produce an error signal. The error signal drives the frequency synthesizer 442 in a direction for reducing the error between the output signal of carrier limiter 426 and the known valid carrier frequency reference signal. The output signal from the video detector 422 is a baseband video signal combined with several high frequency mixing artifacts, where a video baseband filter 430 removes these artifacts. The output signal from video baseband filter 430 is fed to a synchronization pulse clamp (sync clamp) 432, which sets the level of the sync pulses to a standard level. The output signal from sync clamp 432 is sent to a noise inverter 434, which removes any large noise spikes from the signal. The output signal from the noise inverter 434 is sent to a video buffer 436, which is usually configured to drive circuit board impedances of about 1000 to 2000 ohms via a video output port.

The output signal from the noise inverter 434 is also sent to the AGC circuit 438, which compares the level of the synchronization pulses to a signal blanking level to measure the incoming signal strength, and generates a gain control signal. The gain control signal is used by the IF amplifier 420 and RF preamplifier 406 to dynamically adjust the gain of the prior art TV tuner for the desired signal level at the video output port.

The baseband video signal at the output port of the video detector 422 also includes an audio signal in the form of a frequency modulated (FM) subcarrier signal at 4.5 MHz. The FM subcarrier is transmitted to a second audio detector, in this example an FM quadrature demodulator. The FM quadrature demodulator includes a mixer, 450 and an audio carrier phase shifter 460. The audio carrier phase shifter 460 shifts the audio subcarrier of 4.5 MHz by 90 degrees. The mixer 450 mixes the FM subcarrier signal with the 90 degree phase shifted signal to provide a baseband audio signal, which is filtered by a lowpass (30 kHz) filter 452 to remove any undesired high frequency components. The output signal from the lowpass filter 452 is passed to an audio buffer 454 that provides an audio signal at an audio port.

A serial digital interface 444 receives SERIAL DATA and SERIAL CLOCK input signals to provide control and update status for the television receiver.

The bandpass filters 404 and 412 are typically comprised of a plurality of capacitors, inductors and varactor diodes. The video carrier filter 424 is usually comprised of three discrete elements: an inductor and two capacitors. Likewise, audio carrier phase shifter 460 is also comprised of an inductor and two capacitors. In addition to the circuit elements shown as discrete components outside of the circuit elements 405, 410 and 415 shown in FIG. 1, other discrete components (not shown) are connected to the IF and baseband signal processor 410 and to the frequency synthesizer 442 for tuning purposes. Several external capacitors, inductors and/or varactor diodes typically tune the frequency synthesizer 442. The video buffer 436 and the audio buffer 454, typically employ external discrete elements, such as resistors, capacitors and/or transistors. The video baseband filter 430 and lowpass filter 452 may also employ external inductors and capacitors. All external components electrically connected to any of the integrated circuits 405, 410 and 415 are connected therewith via "pinouts". The cost of the integrated circuit is typically proportional to the number of external connections or pinouts required. Hence numerous external components associated with any integrated circuit dictate a cost penalty for the integrated circuit, which may seriously limit miniaturization.

Figure 2:
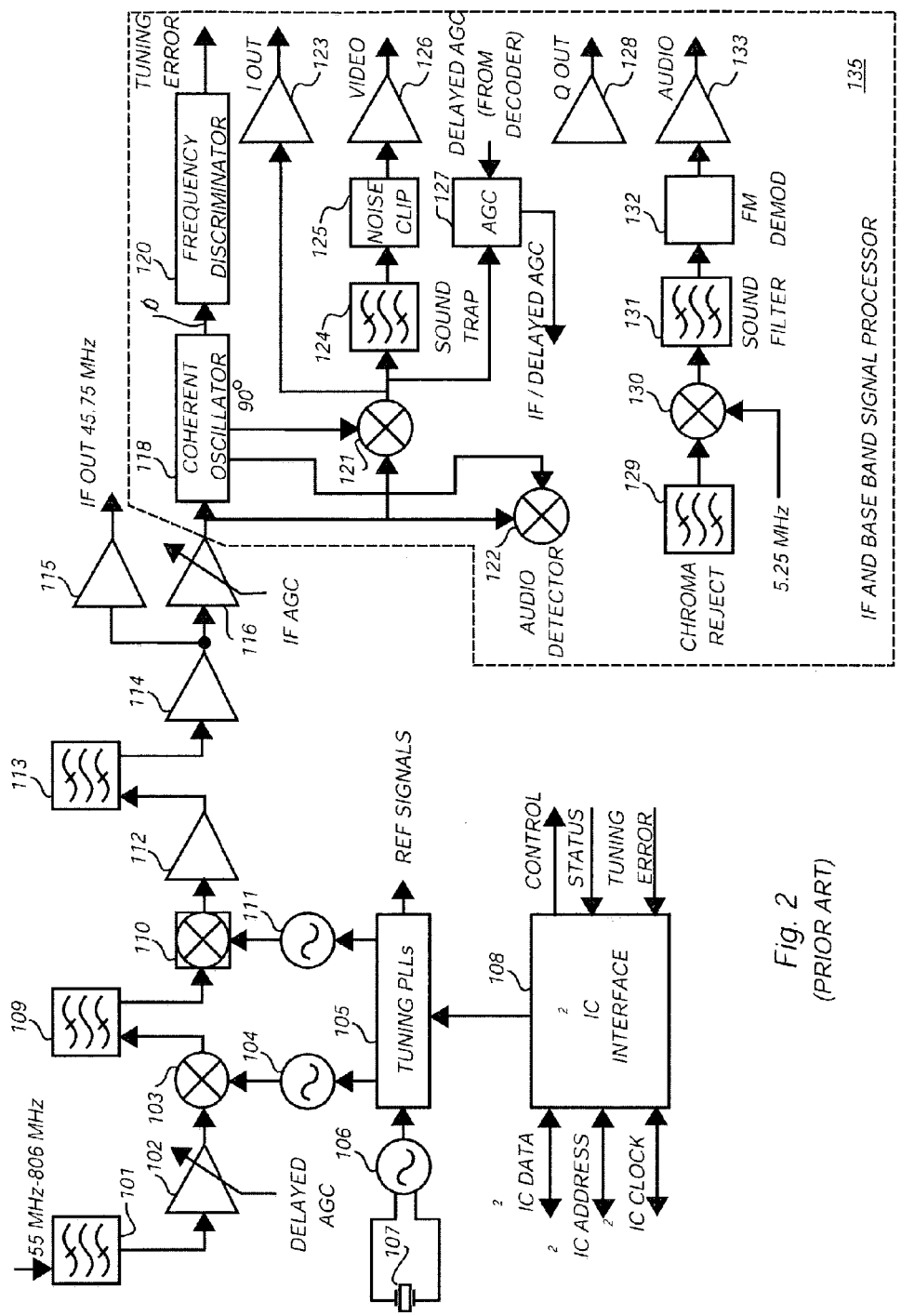
FIG. 2 illustrates a block schematic diagram of a prior art television tuner intended for manufacture by integrated circuit manufacturing methods, substantially as disclosed in the U.S. Pat. No. 6,177,964.

Referring to U.S. Pat. No. 6,177,964, Birleson et al. teach a broadband television tuner, as is shown in the block diagram of FIG. 2. RF signals in a range of 55 Mhz to 806 Mhz are received in the tuner through an input filter 101. The input filter 101 operates to attenuate signals above an input cut-off frequency corresponding to the highest frequency expected in the television band. As distinguished from the prior art TV tuner shown in FIG. 1, the input filter 101 is not tuned to select a few channels but instead passes all channels in the television band from approximately 50 MHz to 800 MHz.

Radio frequency RF signals passing through the input filter 101, are amplified by an amplifier 102. The amplifier 102 operates with a gain as determined by a delayed AGC signal. The amplifier 102 may be provided by either a variable gain amplifier or a variable attenuator coupled in series with a fixed gain amplifier. In any event, this requires that the amplifier 102 be a low noise amplifier (LNA) having a high linearity with respect to the entire television band of frequencies and one that offers a wide dynamic range with respect to received RF signal amplitudes. Preferably the amplifier 102 has a transmission band that is sufficient to pass the entire television band. The amplifier 102 functions to control high input signal levels in the received RF signal since the tuner is capable of receiving signals from a variety of sources, such as an antenna or a cable television line. Typically, one or several antenna channel signals are strong in power, while the remainders are much weaker. This requires that the amplifier 102 have a very broad dynamic range in order that both the weaker signals and the stronger signals are received satisfactorily. In contrast, cable television signals may have signal strengths of +15 dBmV and may comprise 100 cable channels. The amplifier 102 must regulate in accordance with the varying signal levels in this broadband of received channels.

A mixer 103 receives input signals from the AGC amplifier 102 and a local oscillator 104. A first IF signal is generated in the mixer 103 and is provided to a first IF filter 109. The first IF filter 109 is a bandpass filter that provides coarse channel selection. As a matter of design choice, the first IF filter 109 may be constructed on the same integrated circuit substrate as mixers 103 and 101, or the first IF filter 109 may be a discrete off-chip device such as a radio frequency SAW filter. The first IF filter 109 is constructed to select a narrow band of channels, or perhaps only a single channel, from the television signals in the first IF signal.

A mixer 110 mixes the first IF signal from the first IF filter 109 with a second local oscillator signal from a local oscillator 111 to generate a second IF signal. The mixer 110 may be an image rejection mixer, if necessary, to reject unwanted image signals. The characteristics of the first IF filter 109, determines whether or not the mixer 110 should function to provide image rejection. If image frequencies of any desired channel are adequately attenuated by the first IF filter 109, then the mixer 110 is typically a standard mixer.

Tuning phase locked loop (PLL) circuits 105 control local oscillators 104 and 111. Local oscillator frequencies are selected under the control of an Inter Integrated Circuit (IIC or I2C) bus interface 108 so that the picture carrier of a particular channel in the RF television signal spectrum appears at 43.75 MHz in the second IF signal. Of course, some signals at other frequencies may be provided depending on the standards in a particular region or country where the TV tuner is intended for use. The tuning PLL circuits 105 receive reference signals from a reference oscillator 106, which is driven by a 5.25 MHz crystal 107. The I2C interface 108 provides control input signals to the tuner 10 and monitors the status of the tuner 10 and the tuning PLL circuits 105.

In operation, the front end of the TV tuner receives the entire television band through the filter 101 and the amplifier 102. The mixer 103 up-converts the RF input signal so that a selected channel in the RF signal appears at a first IF frequency that is selected to pass through the filter 109. The first IF frequency is then down-converted to a second IF frequency of 43.75 MHz by the mixer 110. The frequency of the first local oscillator signal varies depending upon the specific channel desired in the RF signal. The second local oscillator is also optionally tunable when the second IF frequency is selected to be other than the typical 43.75 MHz.

Following the mixer 110, an amplifier 116, under the control of the AGC, amplifies the second IF signal. Signals being passed by the second IF filter 113 either remain on-chip for further processing or can be provided to an off-chip device, such as a decoder (not shown), through a buffer 115. The amplifier 102 and the amplifier 116 operate in conjunction to control the overall signal level preparatory to further processing by circuit elements 118, 120-133. These circuit elements are connected as shown to provide an IF and baseband signal processor 135.

It is suggested that the second IF filter 113 may be constructed on the same integrated circuit substrate as the other elements of tuner, or it may be a discrete off-chip device. The amplifiers 112 and 114 are used to provide proper impedances for the SAW filter 113 as well as to provide gain to maintain system noise performance. The amplifier 112 must provide a powerful signal at the relatively low impedance preferred for operation of the SAW filter. Heat generated by the power amplification and the SAW filter attenuation is significantly large as compared with other functions in the prior art TV tuner.

It is an object of the present invention to replace the SAW filters used in prior art tuner circuits by other filter circuits. However, a significant restraint in RF and microwave IC design stems from the difficulty in realizing an integrated passive inductor with sufficiently high Q over a broad bandwidth. Large space requirements, low inductance values and low Q factors, make these inductors unsuitable for precision applications, such as for example use in television tuner circuits. It has now been found that, by replacing the SAW filters with active inductor circuits, the active inductor circuit allow for larger inductance values to be realized in a small device footprint as well as provide stability for precision application, such as for use in television tuner circuit. Active inductors are known in the art of circuit design and are described in detail in U.S. Pat. Nos. 5,726,613; 6,028,496; and, 6,130,832 as well as in the literature and are well known to those of skill in the art. A tunable active inductor is described in U.S. Pat. No. 6,211,753.

Advantageously, active inductors are integratable within semiconductor substrates and as such a cost of tuner circuit manufacture using active inductors is reduced because off-chip pins previously used to couple SAW filters to the integrated portion of the tuner circuits are now eliminated. Furthermore, because of improved impedance matching characteristics of these active inductors, amplifiers used to amplify signals prior to filtering by the SAW filters are advantageously eliminated.

Referring to FIG. 3, an active parallel resonant circuit unit 30, including an artificial inductance 31 with a pair of terminals 31$a$ and 31$b$, is shown for use in an embodiment of the invention. A ground lead is connected to ground, and a power lead is provided for receiving input power V. A capacitance 32, in the form of a pair of varactor diodes, is connected across the pair of terminals 31$a$ to provide a functional LC (inductor capacitor) parallel resonant circuit, to form an active parallel resonant circuit unit (APR). The varactor diodes have predetermined dimensions and are operated at an appropriate bias, provided by a source not shown, to provide a required capacitance value for the capacitance 32. In a somewhat similar configuration, a pair of varactor diodes (not shown) provides for a capacitive element in the artificial inductance 31 and determines its effective inductance value. The APR 30 is an example of a parallel resonant circuit which functions as an impedance to a signal applied across the terminals 31$a$ and 31$b$. The circuit unit 30 exhibits maximum impedance at a resonant frequency determined by the values of the artificial inductance 31 and the capacitance 32, and lesser impedances for frequencies other than the resonant frequency. The qualities (Q) of the artificial inductance 31 and the capacitance 32, determine the sharpness of the frequency of maximum resonance, as is well known to those of skill in the art.

Referring to FIG. 4, a switchably selectable bandpass filter is shown for use in an embodiment of the invention, having a narrow bandpass. The resonant circuit unit 30 is identified as an active parallel resonance (APR) 30. The APR 30 is coupled in a feedback network between input and output ports of an inverting amplifier 51. A field effect transistor (FET) 48 is also connected in the feedback network between the input and output ports of the amplifier 51, via source and drain electrodes as shown. The input port of the amplifier 51 is switchably coupled to receive signals via a FET 46. The amplifier 51 is also switchably coupled to supply signals from its output port via a FET 47. Preferably the amplifier 51 is of a high a gain and of a low noise performance as is practically convenient in integrated circuit technology. A power supply lead V is coupled via a FET 45 with a voltage switched (VS) power feed lead. The VS power feed lead is connected to supply operating voltage to the APR 30 and the amplifier 51, and to control the conductive states of the FETs 46-48. The narrow bandpass filter of FIG. 4 is inactive and isolated unless a decoder 40 has received a predetermined code for selecting of the filter. When the filter is selected the decoder 40 activates the filter into an ON state by switching voltage onto the VS power feed lead via the FET 45. Otherwise the decoder 40 maintains the bandpass filter in an OFF state, with only the decoder being powered. Input signals are resistively coupled to the input port via the FET 46 operating with predetermined impedance. Amplified signals are coupled from the amplifier 51 via the FET 47. The APR 30 functions as a nearly all-pass filter providing almost total negative feedback, except for a narrow frequency band of 7 or 8 MHz where little signal energy is passed. The FET 48 is either an enhancement mode, or a depletion mode device, configured to operate with predetermined impedance when voltage is supplied to its gate electrode from the VS lead. The impedance of the FET 48 determines a resistance in parallel with the APR 30, and consequently the effective gain of the amplifier 51 in the narrow frequency band of 7 or 8 MHz. Because the filter shown in FIG. 4 utilizes active elements, in the form of varactors and APR, it is hereinbelow referred to as an active bandpass filter unit (ABP).

Referring to FIG. 5a, a low pass circuit unit (LP) is provided by the artificial inductance 31 and the capacitance 32, where the capacitance 32 is connected between signal ground and the terminal 31b. In operation, a signal applied to the artificial inductance 31, from a signal source (not shown) at the terminal 31a, is conducted to terminal 31b via an impedance that is proportional in value to the value of the artificial inductance 31 at the signal frequency. A portion of the signal appearing at terminal 31b is conducted with an impedance value that is in inverse proportion with respect to the value of the capacitance 32 and with respect to its signal frequency. Thus, as is well known to those of skill in the art, signal energy available to a load (not shown), connected at the terminal 31b, depends upon the source's impedance in series with the impedance of the artificial inductance 31 and the load's impedance in parallel with the impedance of the capacitance 32. In another arrangement, not shown, the capacitance 32 is connected between the terminal 31a and ground.

Referring to FIG. 5b, a high pass circuit unit (HP) is provided by the artificial inductance 31 and the capacitance 32, as shown. The capacitance 32 is connected between a signal source (not shown), having source impedance, and a load (not shown), having load impedance, while the artificial inductance 31 is connected between the signal source and signal ground. A signal applied to the high pass circuit unit is conducted via the impedances of the artificial inductance 31 and the sum of the impedances of the capacitance 32 and the load. The effects of the artificial inductance 31 and the capacitance 32, with respect to signal frequencies is well known as illustrated in the preceding paragraph. Thus, signal energy available to the load depends upon the source's impedance in series the impedances of the capacitance 32 and is loaded by the impedance of the artificial inductance 31. In another arrangement, not shown, the artificial inductance 31 is connected between the terminal 31a and the load.

Referring to FIG. 5c, an active low pass filter circuit unit (ALP) 36 is shown for use in an embodiment of the invention. The ALP 36 utilizes the low pass circuit unit, illustrated in FIG. 5a, connected with input and output buffer amplifiers 33 and 34. The ALP filter characteristics are substantially constant irrespective of source and load impedances, since the ALP 36 contains varactor diodes and other active components (not illustrated).

Referring to FIG. 5d, an active high pass filter circuit unit (AHP) 38 is shown for use in an embodiment of the invention. The AHP 38 utilizes the high pass circuit unit illustrated in FIG. 5d connected with input and output buffer amplifiers 33 and 34. The AHP 38 characteristics are substantially constant irrespective of source and load impedances, since the AHP 38 contains varactor diodes and other active components (not illustrated).

Furthermore, each of the input and output buffer amplifiers 33 and 34, as well as the artificial inductance 31, are connected with a voltage switched (VS) power feed lead, such that when the filter is not needed for the instant operation of a tuner, it is switched OFF and thus does not contribute to electrical power consumption of the tuner circuit.

In the ALP and AHP filter examples shown in FIGS. 5c and 5d, when the power to any one filter is switched OFF, the input buffer amplifier 33 is arranged to have an input impedance tending toward infinity, while the output buffer amplifier 34 is likewise arranged to have an output impedance tending toward infinity. In other words, each filter that is switched OFF, via the VS lead, is effectively isolated from the signal path of the tuner circuit. In an array of circuits based upon filter circuits generally similar to those of FIG. 5c and FIG. 5d, parasitic loadings of a signal source and outputs of switched OFF filter circuits are advantageously avoided.

The filter illustrated in FIG. 6 is similar to the filter illustrated in FIG. 4, with the exception of the APR 30 being replaced by the ALP filter 36 and the AHP filter 38. The ALP and AHP filters 36 and 38, in this example, are arranged to have mutually exclusive passbands and roll-offs defining a mutual stopband with 6 db points at least a MHz outside of a channel width, in the negative feedback path of the filter. As in found in the filter depicted in FIG. 4, the ON impedance of the FET 48 primarily determines the attenuation, or gain, of the filter at the center of the channel frequency. Although the filter shown in FIG. 6 requires more circuit elements, and hence consumes more integrated circuit substrate area for its implementation than does the filter of FIG. 4, the roll off characteristics are more flexible for design purposes.

Figure 7A:
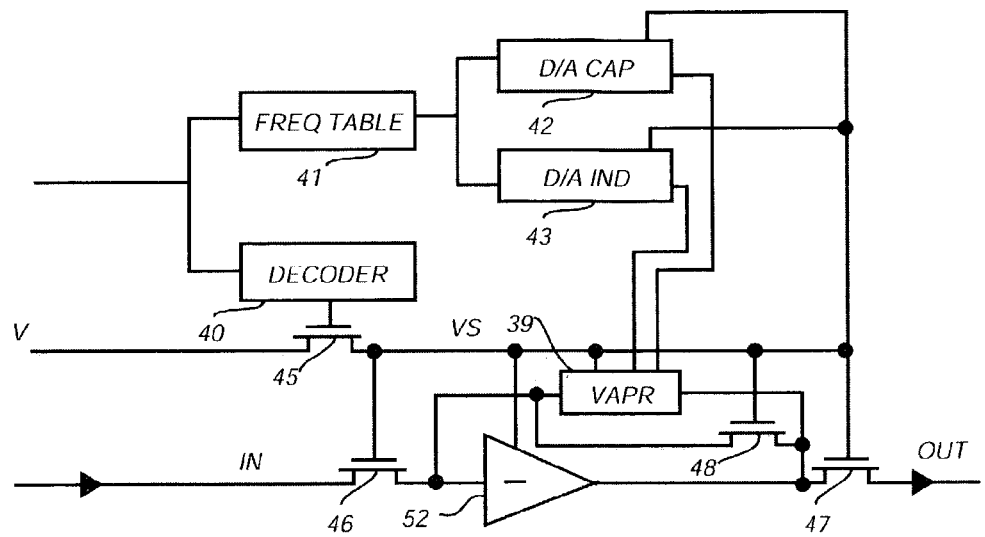
FIG. 7a illustrates a block schematic diagram of an example of a filter including an active switchably tunable parallel resonant circuit useful for providing a filter in a tuner.

The filter illustrated in FIG. 7a is similar to that illustrated in FIG. 4, however in this example the APR is variable, in the form of a variable APR (VAPR) 39. Rather that being biased by fixed elements determined at the time of circuit fabrication, diode elements of the capacitance 32 and the artificial inductance 31 are biased by voltages developed in digital to analog converters labeled D/A CAP 42 and D/A IND 43, respectively. The D/A converter 42 develops a bias voltage for varactor diodes in a capacitive portion of the VAPR 39 and the D/A converter 43 develops a bias voltage for varactor diodes in an artificial inductance portion of the VAPR 39. The bias voltages are developed in response to data provided by a frequency look up table 41. In operation, the decoder is responsive to the most significant few bits of filter selection data to activate the filter elements. The bits of lesser significance are translated in the frequency table 41 and supplied as data to the D/A converters 42 and 43. For example when the filter is operating with a passband for passing channel 2 TV program signals, and a user desired to change to channel 4, the D/A converters switch the filter to operating with a passband for passing channel 4 TV program signals.

Figure 7B:
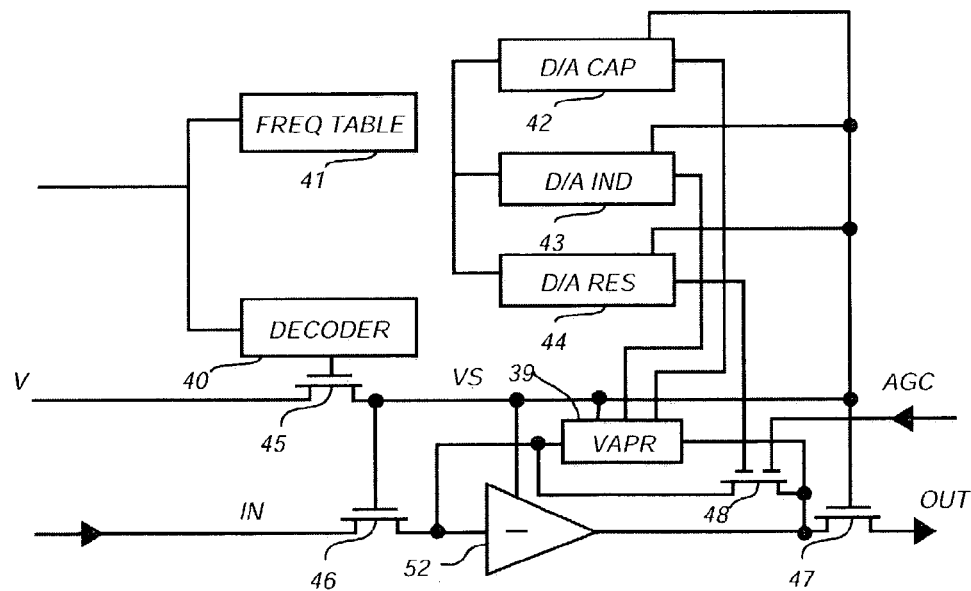
FIG. 7b illustrates a block schematic diagram of a filter similar to the filter shown FIG. 7a and including a switchable and variable gain feature.

The switchably selective filter shown in FIG. 7b is similar to the filter shown in FIG. 7a, but also includes a D/A converter 44, with an output port coupled to a gate electrode of a FET 49. In this example, the FET 49 is shown to be a dual gate FET. The other of the gate electrodes is coupled with an AGC signal from on-following tuner circuitry. In operation, the gain of the filter is specified in the data of the channel selection and is further adjusted in response to the AGC signal developed in the on-following tuner circuitry to regulate the overall gain in the signal path. The passband of the filter, as depicted in either of FIGS. 7a and 7b, is controlled to switch from one channel to another channel in response to data supplied from any of the controller circuits used in the various tuners discussed hereinbelow.

Figure 8:
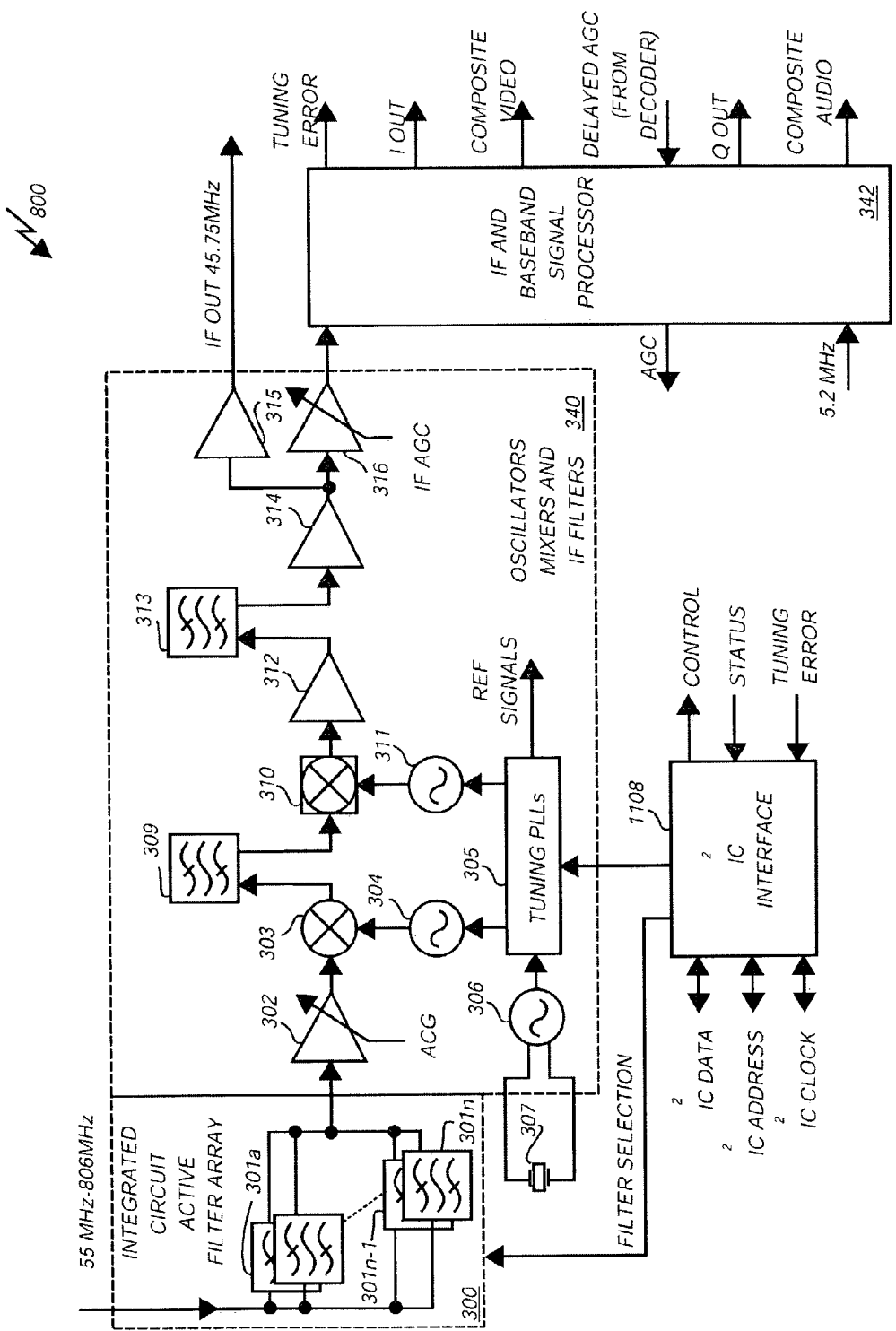
FIG. 8 illustrates a block schematic diagram of an example of a tuner which includes a filter at an input port thereof, in accordance with an embodiment of the present invention and intended for manufacture by integrated circuit manufacturing methods; and, FIG. 9 illustrates a variation of the prior art tuner shown in FIG. 2, where filters are replaced with active filter and thus obviate the need for two amplifier circuits in accordance with another embodiment of the invention.

Referring to FIG. 8, a broadband television tuner according to embodiment of the invention is shown in block diagram form. RF signals are received in the tuner 800 through input filters 301a through 301n. Each input filter 301, in the form of for example those filters illustrated in FIGS. 4, 6, 7a and 7b, is a switchably selectable filter for passing a selected range of frequencies within the frequency range across the television frequency band. In this fashion, the switchably selectable filter 301 passes any one selected channel through careful switching. The selected passband range for each filter is typically a range about a selected channel and is of sufficient size to provide good linearity across the channel passband. For example, each range covers 70 MHz of bandwidth with 20 MHz of overlap to ensure that each channel is somewhat central within a range. In a preferred embodiment, a simple switching network directs the signals through one of a plurality of filters, each filter passing a predetermined range corresponding to a selected channel. Filter 301 operates to attenuate signals above an input cutoff frequency corresponding to a frequency in the television band above the selected channel frequency.

Following filter 301, the RF signal passes through delayed AGC amplifier 302, which operates in conjunction with IF AGC amplifier 316 to control the overall signal level in tuner 800. Amplifier 302 is a variable gain amplifier or a variable gain attenuator in series with a fixed gain amplifier. The preferred embodiment of amplifier 302 comprises a low noise amplifier (LNA) with a high linearity that is sufficient to pass the entire television band. Alternatively, each of the plurality of filters comprises a LNA for amplifying the associated frequency band.

Though the remainder of the circuit functions similarly to prior art tuner circuits by reducing the noise in the overall tuner signal path it also allows for integration of filter components within either the filter 301 or subsequent filters 309 and 313.

When filter 301 is integrated, LNA 302 is optionally designed integrally therewith to provide linearity across the selected range for each possible selected range. As such, design simplification of the overall LNA results.

Because of the need for low power tuner devices for use in various applications, it is highly advantageous to amplify less of the incoming signal—reduce bandwidth—and thereby to limit power consumption by not amplifying signals as much within the tuner 800. Thus, by advantageously using active filters in the forms of those shown in FIGS. 4, 6, 7a and 7b, significant power savings are realized in the tuner circuit 800. No longer are signals amplified within the tuner circuit in order to enable satisfactory operation of the SAW filters.

The filter array 300 of FIG. 4 is formed from a plurality of integrated filter circuits 301a through 301n including active inductors therein. Because of the variety and nature of active inductors, their use in the tuner 30 is highly advantageous. Typically, a small amount of linearity is lost when straying from prior art discrete filter components. Here, that loss of linearity is insignificant because of the nature of the filtering process, which is used to reduce noise within the tuner circuit.

Of course, the use of active inductors within the filters 301 allows for integration of the selectable filter component within the tuner, thereby reducing parts count, size, and significantly reducing power consumption of the tuner. Also, pins are not required for providing filtered signals to the tuner integrated circuit and thus the integrated circuit components used to support those input pins are advantageously obviated.

Furthermore, for reduced tuner 800 power consumption, only a small portion of the front-end filters in the tuner 800 are active at any instant, thereby offering reduced power consumption, where the power consumption is less than that of the power consumption of the bulk of the integrated circuit. Furthermore, the reduced spectrum provided to the on following superheterodyne circuitry reduces filtering requirements in the on-following circuitry, making on-chip filters more practical.

When the filter 301a to 301n is selected by data from the tuner controller 1108, the filter is switched to the appropriate channel in accordance with stored data at the storage location addressed by the selection data, and operates with the desired passband. Accordingly, the tuner 800 is tunable over a plurality of decades of the television frequency band. As it may be difficult to construct a variable filter, which is entirely integrated and variable from tens of megahertz up to almost a gigahertz, several filters of appropriately different geometries are each individually selectable for receiving a corresponding portion of the television signal band.

Optionally, when an active inductor forms part of the filter circuit, it is used to provide some signal amplification as well. Thus, an amplifier/filter component is designed for each selectable band, thereby reducing amplifier complexity since the amplifier is a narrow band device that operates within a known band. Small amounts of nose outside this known band are not of concern.

The resulting tuner 800, according to this embodiment of the invention, provides enhanced filtering over prior art tuner devices with integrated input filtering and thereby reduces overall cost and improves performance. Further, since the dynamic range of each of the active inductors is known within its filter, dynamic range concerns in inductor design are obviated.

Figure 9:
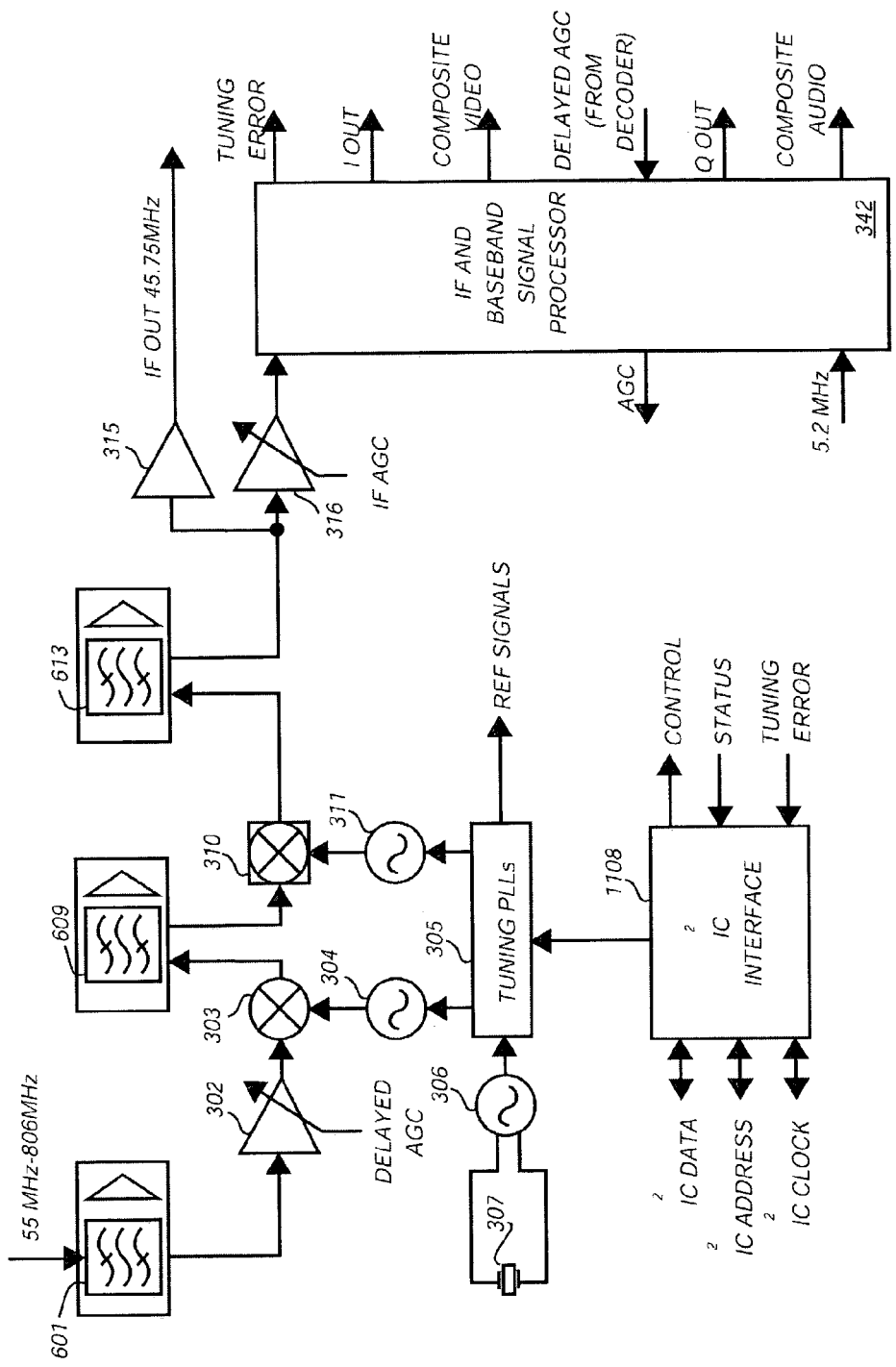

Referring to FIG. 9, a tuner circuit 900 is shown in accordance with another embodiment of the invention, where each of the three filters, 101, 109 and 113 (prior art FIG. 2) are replaced with integrated filters 601, 609 and 613. Since, integrated filters typically have reduced linearity, the three filters 601, 609 and 613 are designed to work in conjunction with each other within the tuner to reject noise signals within the overall signal. Though the active inductors typically draw more power than a discrete filter component, integrating the inductor obviates two pins on the integrated circuit and thus improves the use of real estate within the integrated circuit. Furthermore, it reduces power consumption used to drive an off-chip signal and reduces circuitry to drive and protect input pins and output pins of the integrated circuit. Also, the use of integrated filters allows for filtering, amplification, and optionally mixing circuitry to be combined in a single integrated circuit for more effective use of components. For example, when an active inductance is used within the filter 613, amplification is integratable with the active filter, thereby obviating the need for two amplifiers 112 and 114. This replacement of course assumes that the passband of active filter 613 is one channel wide.

Of course, the replacement of a single filter within the tuner circuit with an integrated circuit, including an active inductor, is advantageous over the prior art. Besides reducing pin count, the active inductors are capable of facilitating tuner design by providing gain within the active filter functional block. This advantageously provides signal switching, improves reliability of the overall tuner and reduces the tuner's power consumption. Reducing tuner power consumption advantageously allows for its use in new low power applications. Furthermore, by providing active inductor filter circuits within the tuner, it allows the tuner to operate using significantly less power and thus potentially allows for designing a tuner that enables energizing power to be received from the coaxial cable service provider's cable feed. Heretofore this has been considered impractical because of the significant power consumption of a multitude of tuners, which are typically connected to any cable feed.

Numerous other embodiments may be envisioned without departing from the spirit or scope of the invention.

What is claimed is:

1. A tuner for receiving information signals within a channel selected from within a plurality of channels within a predetermined frequency band, the tuner comprising:
   a first filter for providing a passband, the passband being characterized by a bandwidth sufficiently broad to admit signals in at least one of the plurality of channels with lesser attenuation than other signals;
   an input port for receiving information signals and conducting the received information signals to the first filter;
   an output port for conducting any signals having been admitted by the first filter; and
   superheterodyne circuitry including a mixer and a second filter for processing any signals coupled thereto and to provide them via a second output port and discriminating the received information signals within the selected channel,
   wherein at least one of the first filter and the second filter comprises active and passive elements including an artificial inductance, and
   wherein the first filter comprises:
   a filter selection signal port for receiving a filter selection signal; and, a plurality of bandpass filters each including a decoder responsive to the filter selection signal for designating a corresponding one of the plurality of passbands for asserting a switch ON signal and a switch for activating the bandpass filter in response to the switch ON signal from the decoder and for otherwise maintaining the bandpass filter in an OFF state.

2. A tuner for receiving information signals within a channel selected from within a plurality of channels within a predetermined frequency band, the tuner comprising:
   a first filter for providing a passband, the passband being characterized by a bandwidth sufficiently broad to admit signals in at least one of the plurality of channels with lesser attenuation than other signals;
   an input port for receiving information signals and conducting the received information signals to the first filter;
   an output port for conducting any signals having been admitted by the first filter; and
   superheterodyne circuitry including a mixer and a second filter for processing any signals coupled thereto and to provide them via a second output port and discriminating the received information signals within the selected channel,
   wherein the first filter comprises active and passive elements including an artificial inductance,
   wherein the second filter comprises active and passive elements including an artificial inductance, and
   wherein the first filter comprises:
   a plurality of bandpass filters each comprising:
   a filter selection signal port for receiving a filter selection signal; and,
   active and passive elements including the artificial inductance, a switch and a digital to analog converter, the switch being responsive to data representing the filter selection signal for activating the bandpass filter and the digital to analog converter and the activated digital to analog converter being responsive to said data for generating a bias voltage for controlling at least the artificial inductance and thereby selecting a passband of operation in the activated bandpass filter.

3. A tuner as defined in claim 2 wherein each of the bandpass filters further comprises:
   a frequency table for converting data representing the filter selection signal to a passband selection signal for use by the digital to analog converter, whereby a selected filter is switchable to any of a plurality of predetermined passbands.

4. A tuner for receiving information signals within a channel selected from within a plurality of channels within a predetermined frequency band, the tuner comprising:
   a first filter for providing a passband, the passband being characterized by a bandwidth sufficiently broad to admit signals in at least one of the plurality of channels with lesser attenuation than other signals;
   an input port for receiving information signals and conducting the received information signals to the first filter;
   an output port for conducting any signals having been admitted by the first filter; and
   superheterodyne circuitry including a mixer and a second filter for processing any signals coupled thereto and to provide them via a second output port and discriminating the received information signals within the selected channel,
   wherein at least one of the first filter and the second filter comprises active and passive elements including an artificial inductance,
   wherein at least one of the first and second filters is integrated within a semiconductor substrate,
   wherein the integrated first filter is a bandpass filter integrated within the semiconductor substrate, and
   wherein the reactance elements comprise an amplifier, the artificial inductance, and a variable capacitance arranged in a feedback circuit with the amplifier for defining a passband of amplification, and comprising:
   a filter selection signal port for receiving a filter selection signal;
   a frequency data table for converting the filter selection signal to corresponding bias data signals; and,
   a capacitance D/A bias converter and an inductance D/A bias converter, being coupled to the variable capacitance and the artificial inductance, respectively, and being responsive to receive one of the bias data signals for adjusting the effect of the reactance elements within a passband filter function as designated by the filter selection signal.

* * * * *